(12) United States Patent
Nordgren et al.

(10) Patent No.: US 6,914,423 B2
(45) Date of Patent: Jul. 5, 2005

(54) PROBE STATION

(75) Inventors: Greg Nordgren, Wilsonville, OR (US); John Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 214 days.

(21) Appl. No.: 09/881,312

(22) Filed: Jun. 12, 2001

(65) Prior Publication Data

US 2002/0027434 A1 Mar. 7, 2002

Related U.S. Application Data

(60) Provisional application No. 60/230,552, filed on Sep. 5, 2000.

(51) Int. Cl.$^7$ ............................................... G01R 31/26
(52) U.S. Cl. ..................... 324/158.1; 324/765
(58) Field of Search .............................. 324/158.1, 765; 269/55, 56; 279/2.19, 19.2, 19.3

(56) References Cited

U.S. PATENT DOCUMENTS

| | | | | |
|---|---|---|---|---|
| 4,786,867 A | * | 11/1988 | Yamatsu | 324/758 |
| 5,457,398 A | * | 10/1995 | Schwindt et al. | 324/754 |
| 5,521,522 A | * | 5/1996 | Abe et al. | 324/758 |
| 5,561,377 A | * | 10/1996 | Strid et al. | 324/754 |
| 5,604,444 A | * | 2/1997 | Harwood et al. | 324/754 |

* cited by examiner

Primary Examiner—Evan Pert
Assistant Examiner—Tung X. Nguyen
(74) Attorney, Agent, or Firm—Chernoff, Vilhauer, McClung & Stenzel

(57) ABSTRACT

A chuck assembly includes a rotational member and an auxiliary chuck. The rotational member is suitable for supporting a chuck thereon wherein the rotational member is rotatable with respect to the chuck assembly. The auxiliary chuck is free from rotating with respect to the chuck assembly.

23 Claims, 15 Drawing Sheets

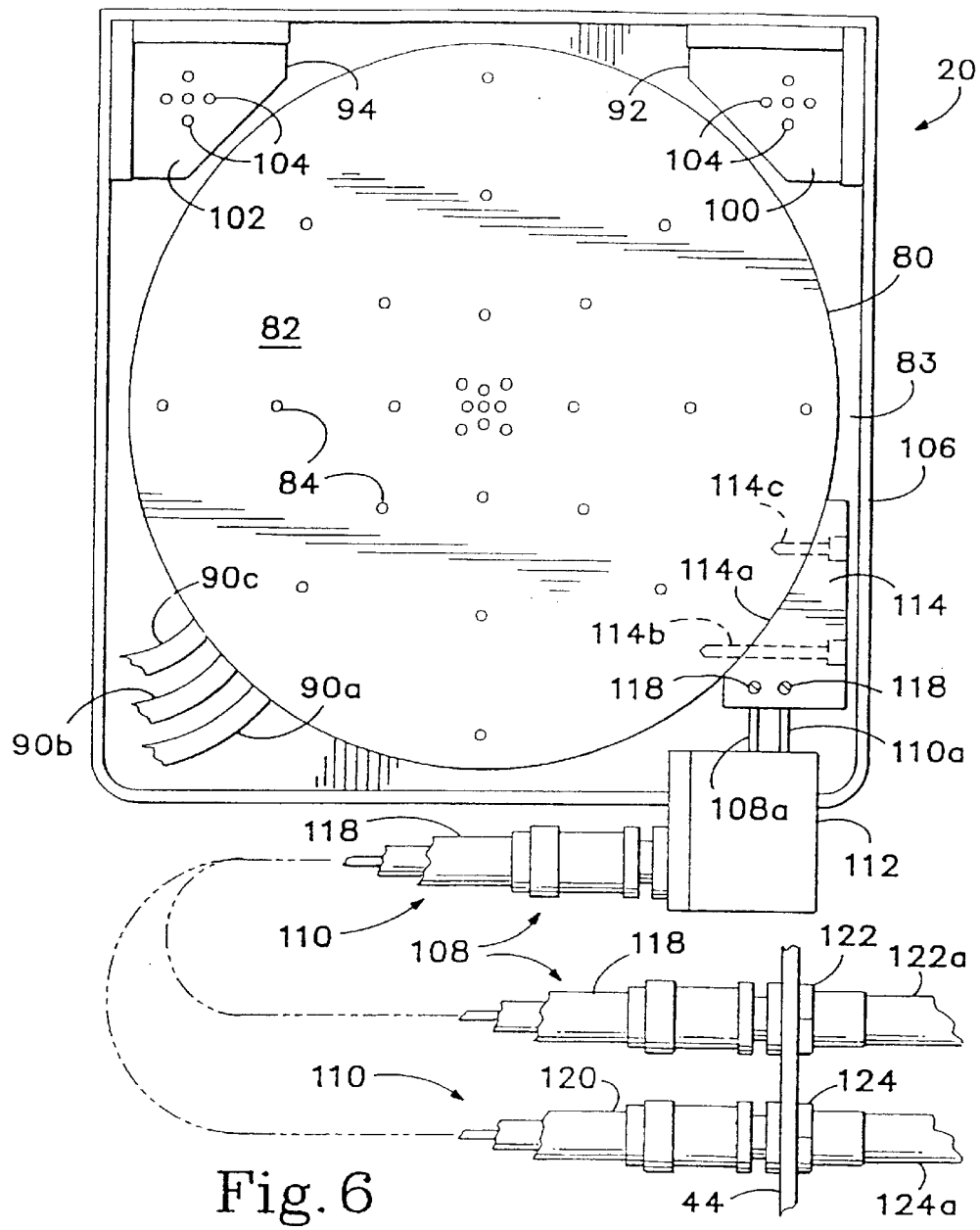
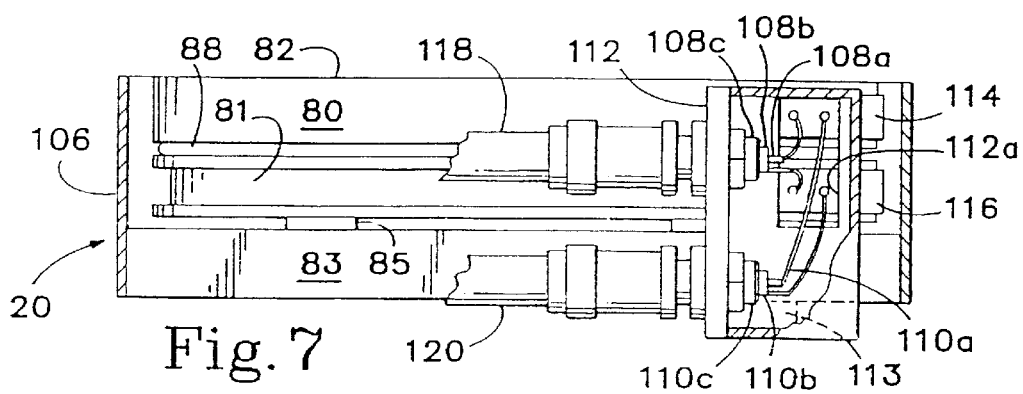
Fig. 6
Fig. 7

PROBE STATION

This application claims the benefit of Provisional Application Ser. No. 60/230,552, filed Sep. 5, 2000.

BACKGROUND OF THE INVENTION

The present application relates to a probe station.

With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e., horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes, respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18 a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably, the spacers and washers 85 and 86, respectively, are constructed of a material having the lowest possible dielectric constant consistent with high dimensional stability and high volume resistivity. A suitable material for the spacers and washers is glass epoxy, or acetyl homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b. U.S. Pat. No. 5,532,609 discloses a probe station and chuck and is hereby incorporated by reference.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 2A is a partial top view of the wafer probe station of FIG. 1 with the enclosure door shown partially open.

FIG. 3A is an enlarged sectional view taken along line 3A—3A of FIG. 3.

FIG. 6 is a partially schematic top detail view of the chuck assembly, taken along line 6—6 of FIG. 3.

FIG. 7 is a partially sectional front view of the chuck assembly of FIG. 6.

DETAILED DESCRIPTION OF THE PREFERRED EMBODIMENT

The probes may be calibrated by using test structures on the calibration substrates supported by the auxiliary chucks 92 and 94. During calibration the chuck assembly 20, as previously described in the background, is normally aligned with the probes. A wafer placed on the chuck assembly 20 is not normally accurately aligned with the auxiliary chucks 92 and 94, and hence the probes. In order to test the wafer the entire chuck assembly 20, including the auxiliary chucks 92 and 94, is rotated to align the wafer with the positioners 24 and their respective probes. Typically, during testing the chuck assembly 20 is rotated to realign the test structures on the calibration substrates supported by the auxiliary chucks 92 and 94 with the probes. After further calibration, the entire chuck assembly 20, including the auxiliary chucks 92 and 94, is again rotated to align the wafer with the positioners 24 and their respective probes. Unfortunately, the theta adjustment of the chuck assembly 20 may not be sufficiently accurate for increasingly small device structures. Multiple theta adjustments of the chuck assembly 20 may result in a slight misalignment of the chuck assembly 20. As a result of such misalignment it may become necessary for the operator to painstakingly manually adjust the theta orientation of the chuck assembly 20.

Smaller environmental control enclosures require less time to create suitable environmental conditions within the environmental control enclosure for accurate measurements. The environmental control enclosure is sufficiently large to permit the chuck assembly to move the entire wafer under the probes for testing. However, if the chuck assembly 20 is rotatable with respect to the environmental control enclosure then the environmental control enclosure needs additional width to prevent the corners of the chuck assembly 20 from impacting the sides of the environmental control enclosure.

Normally the encoders within the stage supporting the chuck assembly include software based compensation for non-proportional movement to achieve accurate movement in the X and Y directions over the entire range of movement. The software compensation of the encoders also depends on the X and Y position of the chuck relative to the probes. In other words, at different X and Y positions over the entire range of movement of the chuck the amount of compensation provided to the encoders may vary. This variable compensation depending on the X and Y position of the chuck results in complicated spatial calculations for appropriate encoder control. The spatial calculations are further complicated when the chuck is rotated to accommodate the auxiliary chuck calibration.

Figure 1:
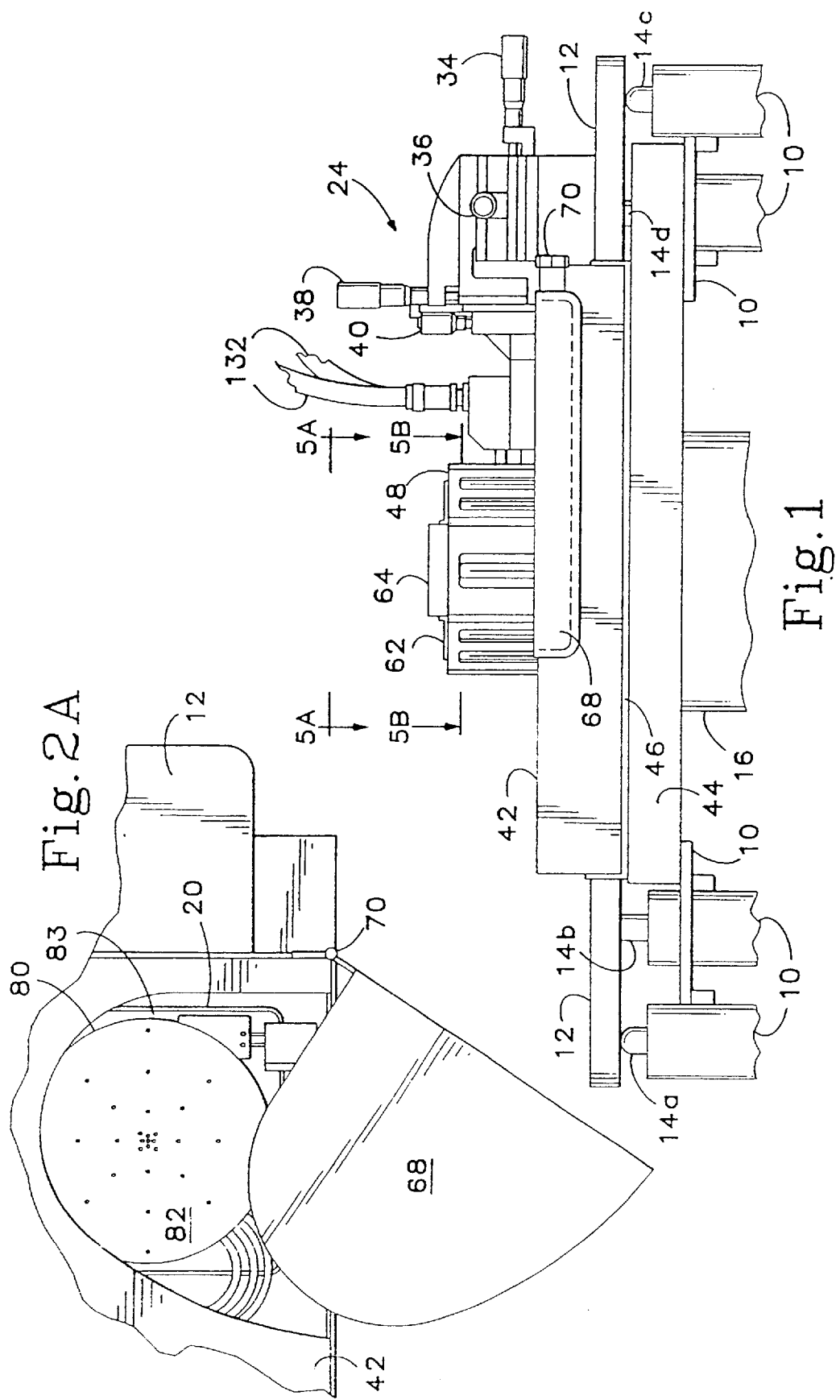
FIG. 1 is a partial front view of an exemplary embodiment of a wafer probe station constructed in accordance with the present invention.
Figure 2:
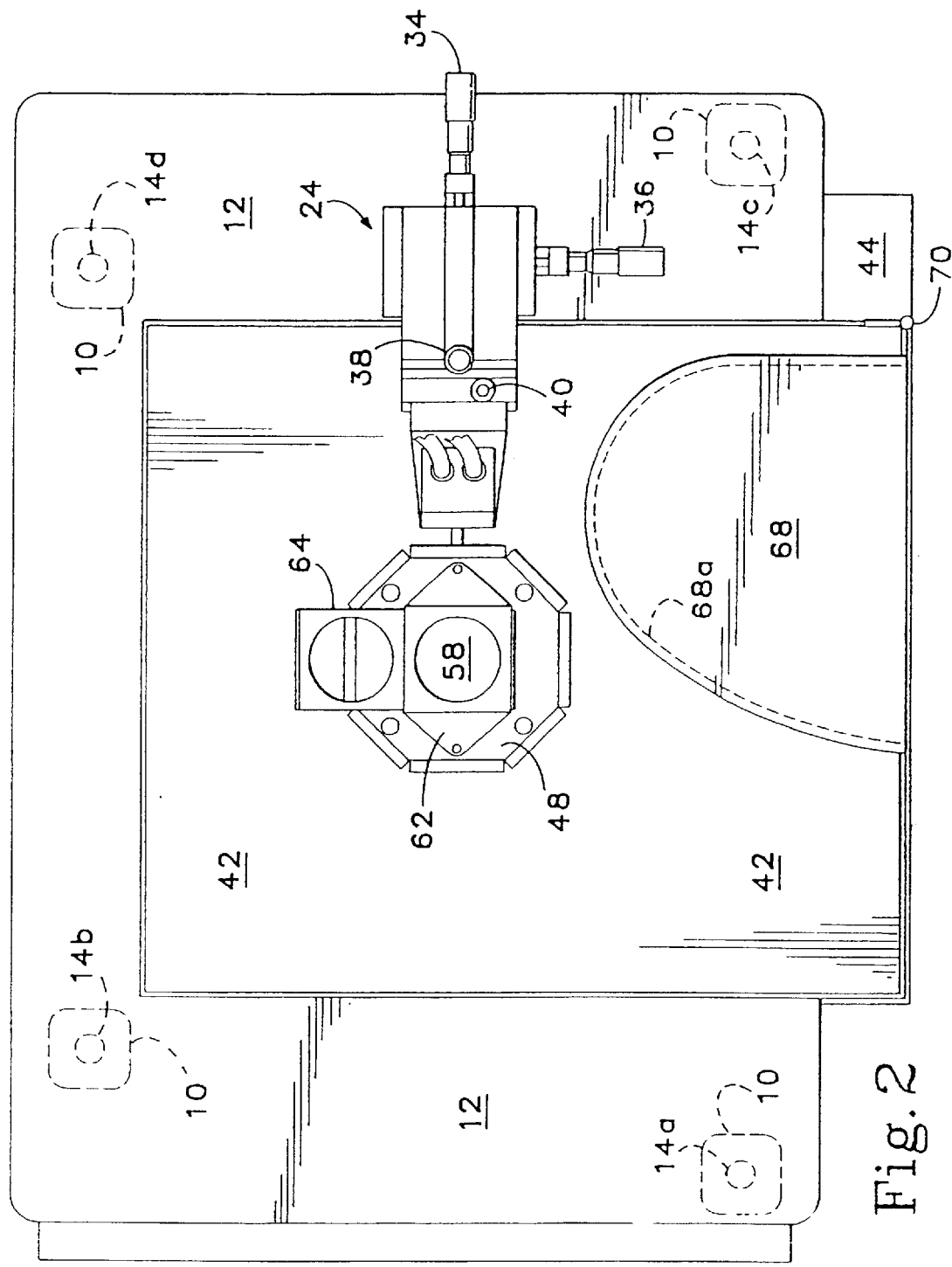
FIG. 2 is a top view of the wafer probe station of FIG. 1.
Figure 3:
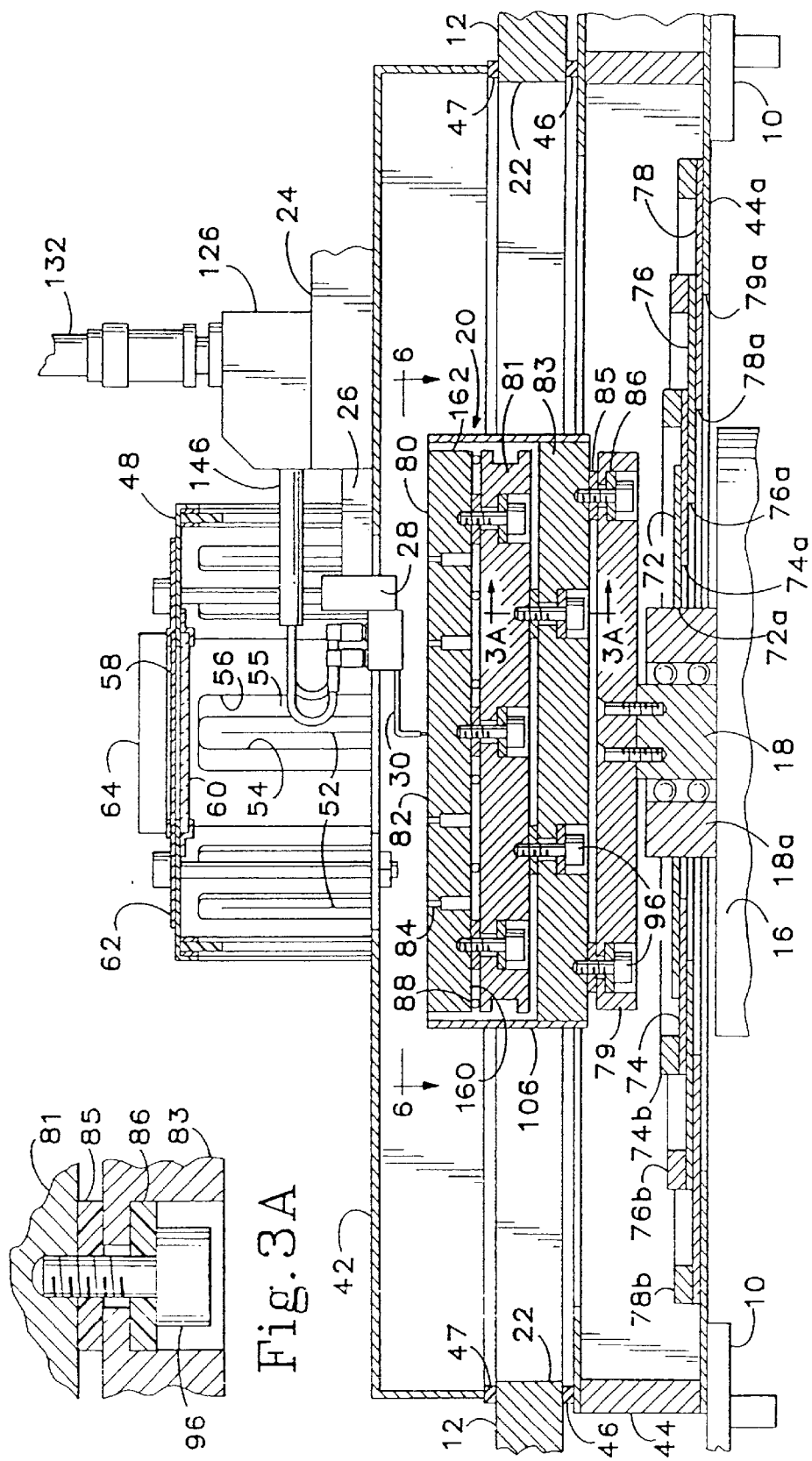
FIG. 3 is a partially sectional and partially schematic front view of the probe station of FIG. 1.
Figure 4:
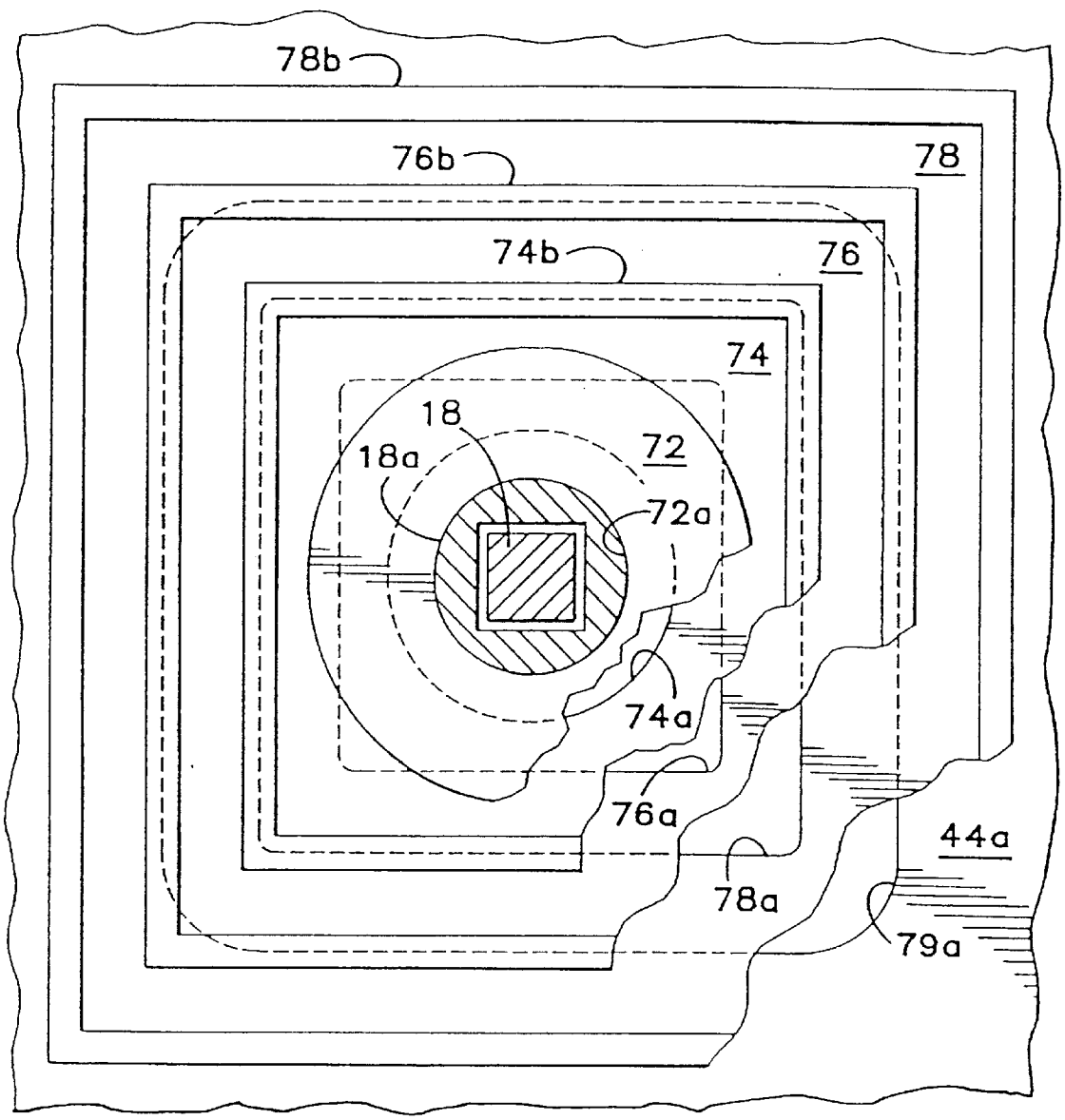
FIG. 4 is a top view of the sealing assembly where the motorized positioning mechanism extends through the bottom of the enclosure.
Figure 5A:
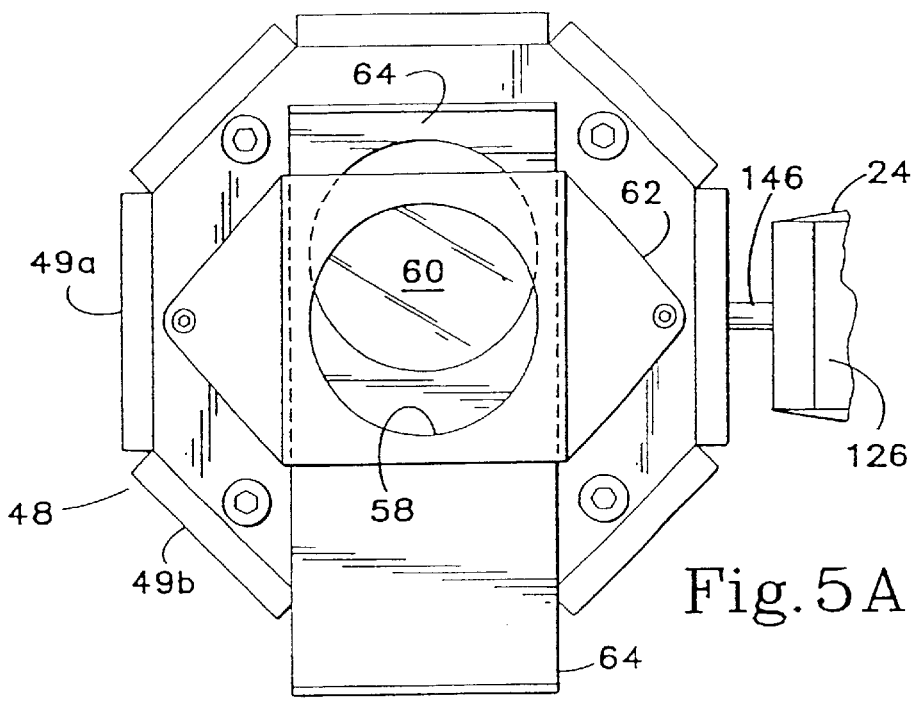
FIG. 5A is an enlarged top detail view taken along line 5A—5A of FIG. 1.
Figure 5B:
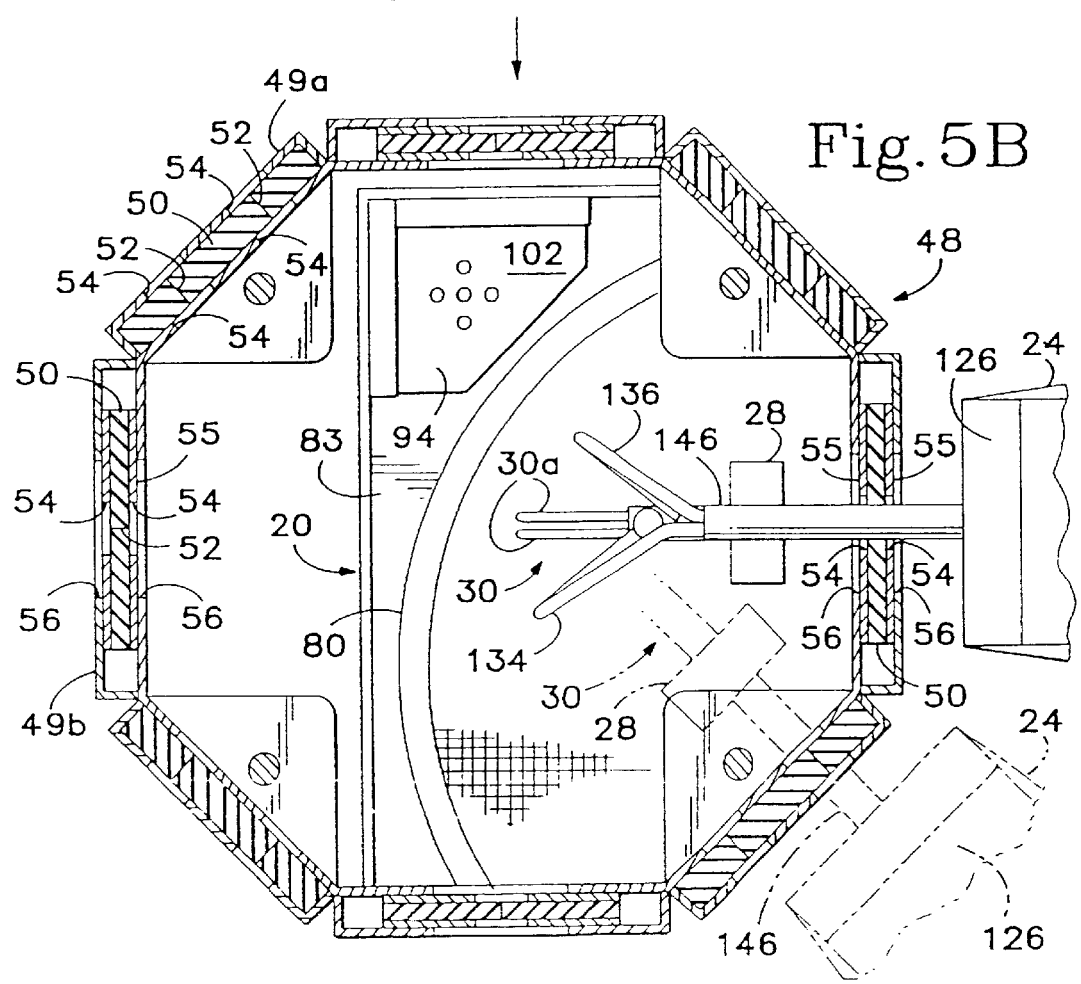
FIG. 5B is an enlarged top sectional view taken along line 5B—5B of FIG. 1.
Figure 8:
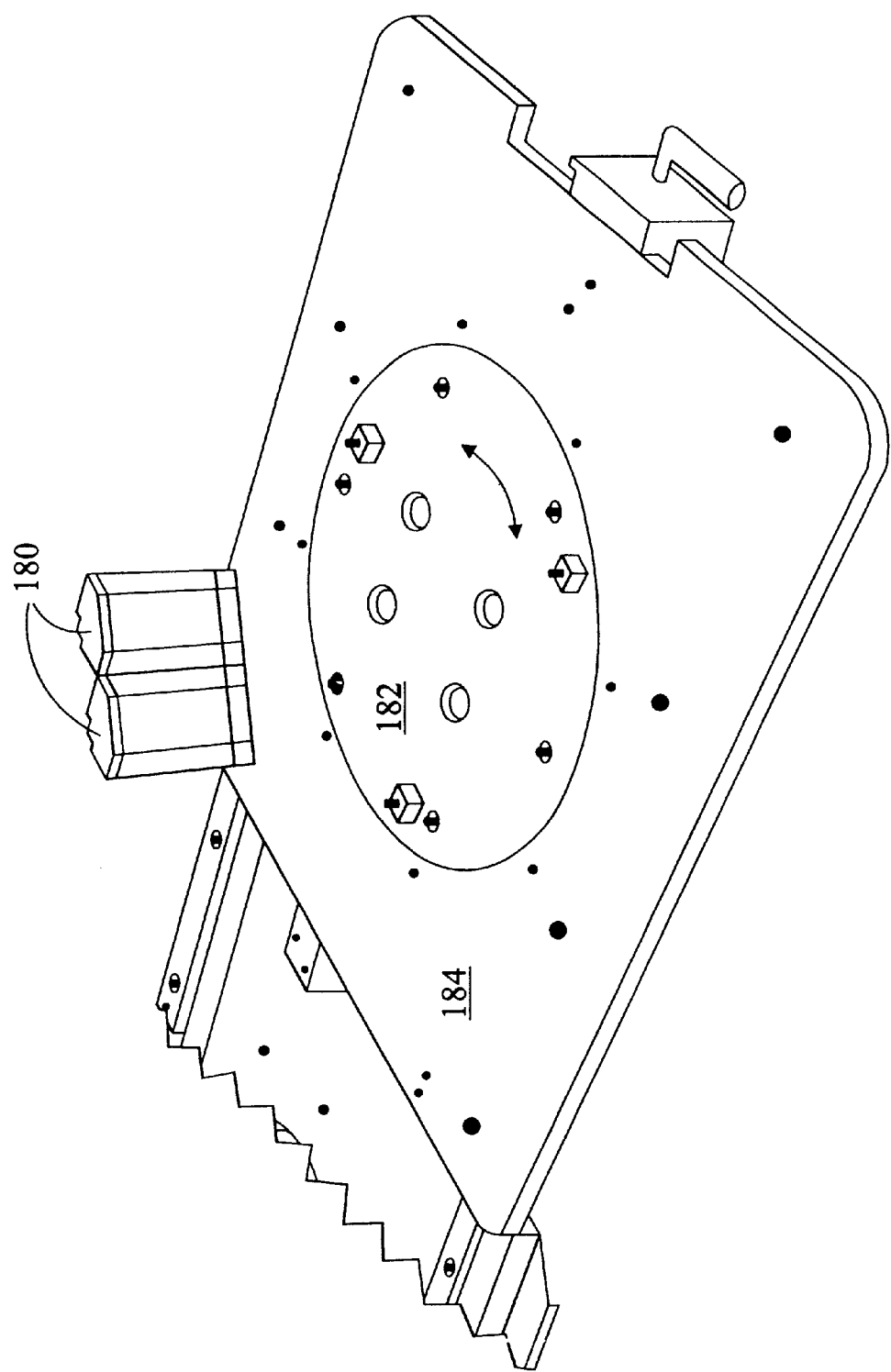
FIG. 8 illustrates an adjustment plate and a surrounding positional stage.

To overcome the limitations associated with misalignment of the theta orientation of the wafer, to reduce the size of the environmental control enclosure, and/or to simplify the compensation for the encoders over the X and Y movement, the present inventors came to the realization that the chuck supporting the wafer should rotate with respect to the auxiliary chuck, as illustrated by FIG. 8. FIG. 8 illustrates the adjustment plate 182 and a surrounding positional stage 184. Accordingly, auxiliary chucks 180 preferably maintain a fixed X and Y orientation with respect to the probe positioners and their respective probes. In this manner, the auxiliary chucks are always properly orientated with the probes positioners and the probes. During use, the chuck (supported by the adjustment plate 182) with a wafer thereon is rotated to the proper theta position with respect to the probes for probing the wafer. Thereafter, the theta adjustment of the chuck may remain stationary during subsequent probing of the wafer and recalibration using the auxiliary chucks. In this manner, typically the chuck assembly needs to only be moved in X, Y, and potentially Z directions to achieve complete probing of an entire wafer. Accordingly, the environmental control enclosure does not necessarily need to be sufficiently wide to accommodate rotation of the positional stage. Also, the encoder compensation may be simplified.

During probing with the chuck assembly 20, as described in the background, it became apparent that probing toward the edges of the wafer tended to result in "wobble" of the wafer and chuck assembly 20. In addition, some existing probe assemblies include the chuck assembly elements supported by a set of linear bearings that permit the upper chuck assembly elements together with the bearing to be slid out of the environment enclosure for loading the wafer onto the chuck assembly. The resulting structure is heavy, and positioned on top of and supported by a plunger affixed to the top of the Z-axis movement of the chuck assembly 20.

Figure 9:
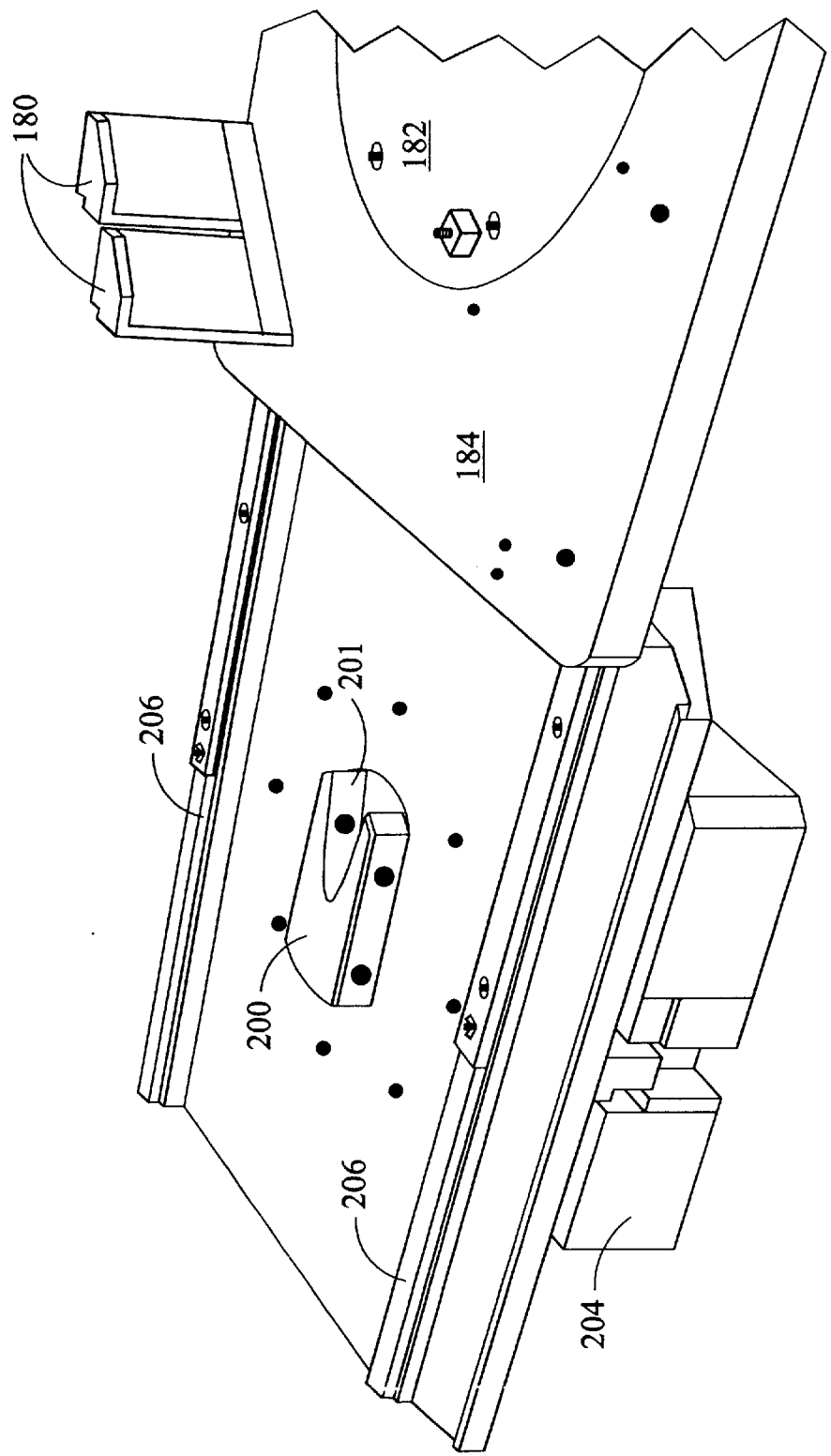
FIG. 9 illustrates an extended positional stage.

To reduce the wobble occurring during probing and reduce the stress applied to the plunger, the present inventors developed a modified arrangement to nearly eliminate the vertical loads on the plunger. Referring to FIG. 9, a modified arrangement includes a central plunger 200 providing rotational movement to the adjustment plate 182 and hence a chuck supported thereon. The central plunger 200 may include a receptacle 201 that moves within a tab 203. The positional stage 184 and auxiliary chucks 180 are supported by the stage 204 surrounding the central plunger 200 which provides the X, Y, and Z movement. Preferably, the stage includes the central plunger 200. The positional stage 184 includes an internal bearing (not shown) upon which the adjustment plate 182 rotates. Accordingly, the positional stage 184 is the primary load bearing member for the adjustment plate 182 and chuck thereon. Spaced apart linear bearings 206 provide a vertical and lateral load bearing support to the rotational chuck while the central plunger 200 provides the rotational movement to the chuck without (free from) being the primary load bearing member. The plunger 200 preferably maintains substantially constant vertical position with respect to the adjustment plate 182 when the stage 204 provides vertical "Z" movement of the positional stage.

Unlocking a lock permits the positional stage 184, including the rotational chuck, to slide out of the probe station for easier placement of wafers thereon. Normally when the positional stage 184 is extended, the wafer thereon is adjusted or otherwise replaced with a different wafer for subsequent testing. After repeated movement of the stage in and out of the probe station, together with rotational movement of the chuck (theta adjustment), the present inventors determined that the resulting theta movement of the chuck may be significantly different than the initial "zero" theta. In other words, after repeated use the adjustment plate 182 may be offset by a significant theta offset. Such significant potential theta offset may result in the cabling to the chuck, normally provided by a rollout service loop, being wound about the chuck assembly creating a significantly greater tension thereon or otherwise damaging the cabling or chuck. The adjustment plate 182 may include a rotational theta limit about "zero" to minimize potential damage. A suitable rotational limit may be ±7.5 degrees. A further limitation exists in the case that the adjustment plate 182 is rotated to a position near its rotational limit because the user may not be permitted further rotational movement in that direction when aligning another wafer thereby resulting in frustration to the user. To overcome these limitations the rotational orientation of the adjustment plate 182 (chuck) is returned to "zero" prior to sliding the positional stage 184 out of the probe station. In this manner, the chuck is always at a constant rotational position, such as 0 degrees, when a wafer is positioned thereon so that the likelihood of damaging the probe station by unintended tension on the wires and other interconnections to the chuck assembly is reduced. In addition, the range where the chuck is orientated prior to sliding out the positional stage 184 may be any predefined range of values. Also, the user maintains the ability to rotate the adjustment plate 182 as necessary during further alignment.

While the positional stage 184 is extended the user may attempt to rotate the adjustment plate 182. Unfortunately, this may result in difficulty engaging the tab 203 with the receptacle 201 when the positional stage 184 is retracted. This difficulty is the result of the rotation of the lunger 200 not likewise rotating the positional stage as in existing designs.

Figure 10:
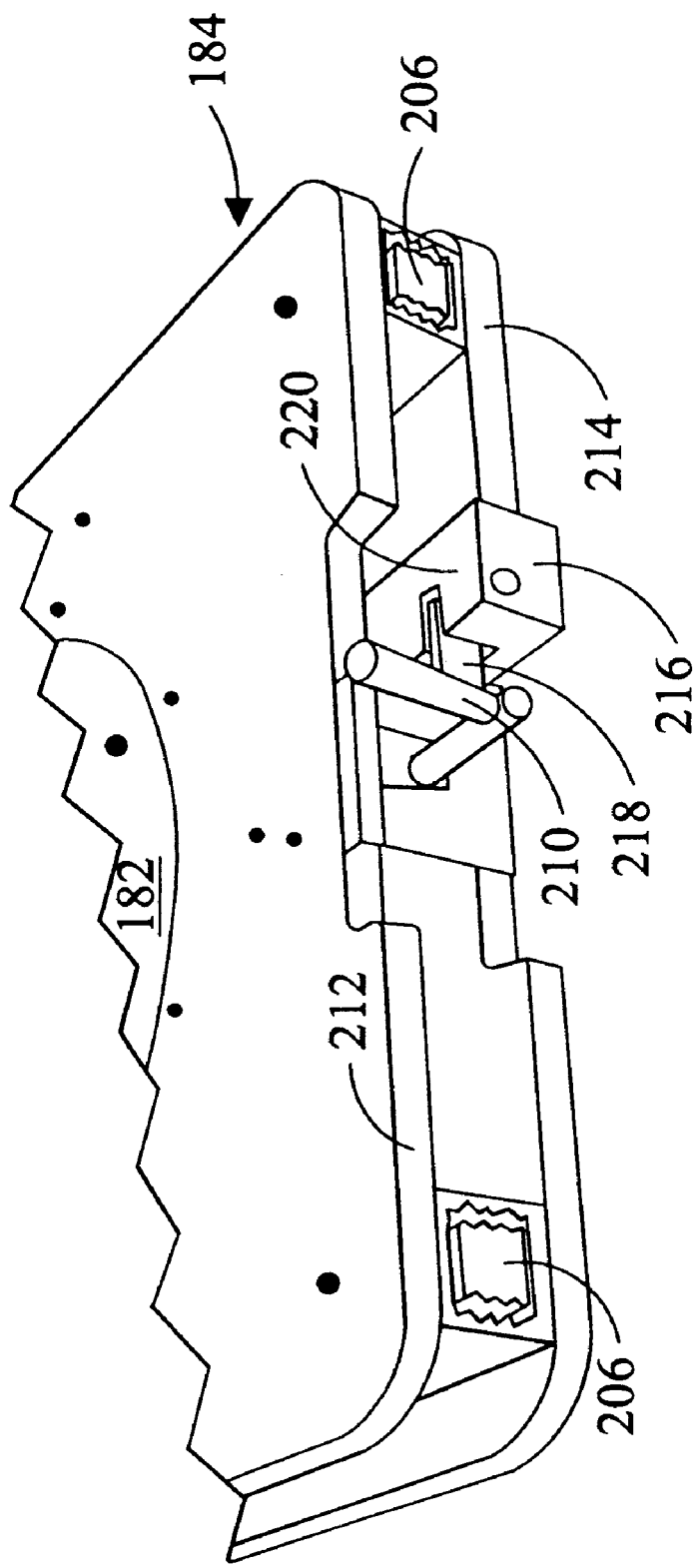
FIG. 10 illustrates a locking mechanism for the positional stage.

Referring to FIG. 10, the "zero" theta lockout may be provided by a mechanical arrangement together with a locking mechanism. A rotational handle 210 is secured to the upper plate 212 of the positional stage 184. A block 216 as secured to the lower plate 214 of the positional stage 184, which is rigidly attached to the housing 204. A finger 218 is inserted within a slot 220 defined by the block 216 to rigidly lock the upper plate 212 in position. The handle 210 is rotated to remove the finger 218 from the slot 220 to permit relative movement of the upper plate 212 with respect to the lower plate 214.

Figure 11:
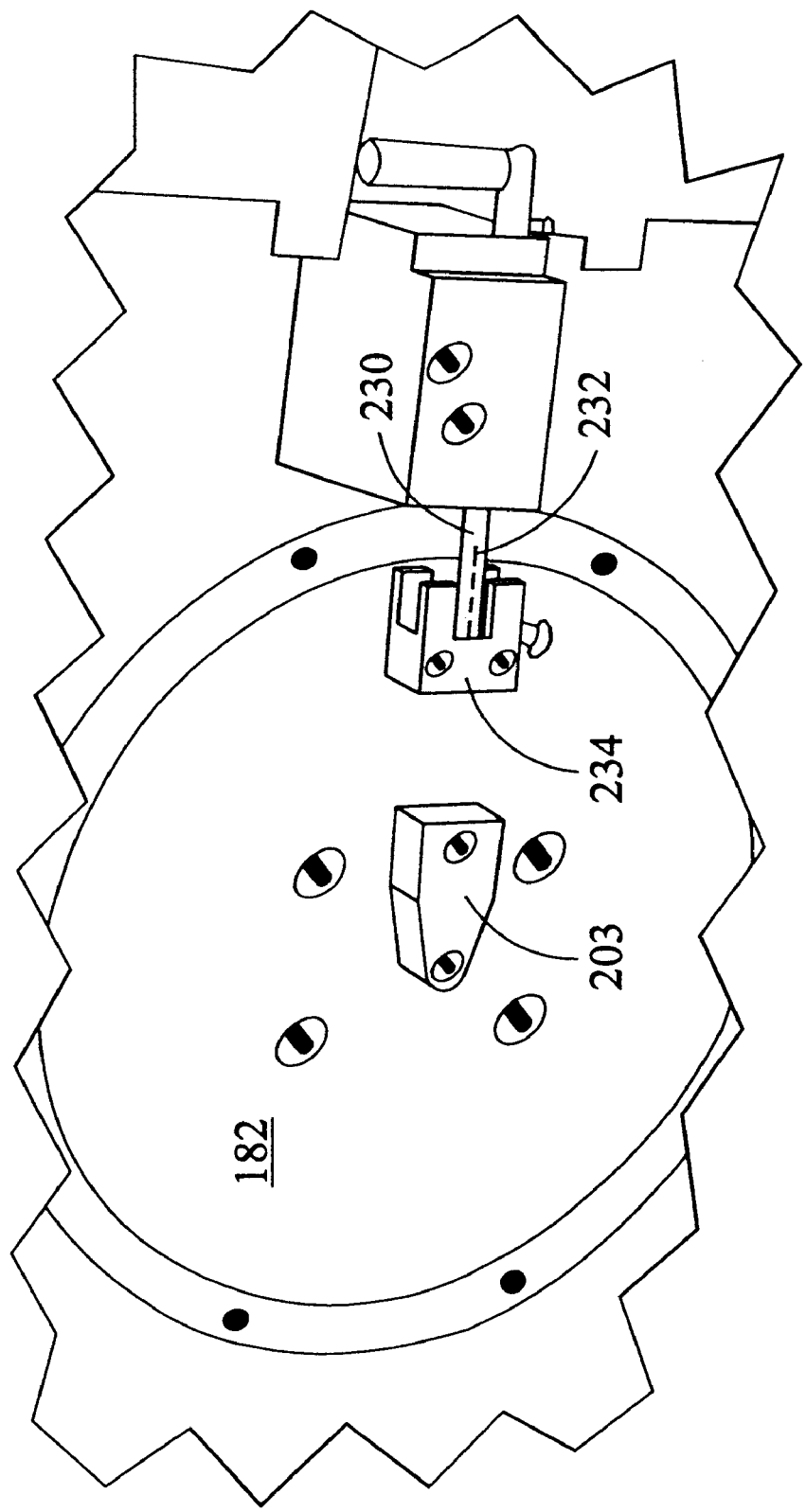
FIG. 11 illustrates a locking mechanism for the adjustment plate and a tab for rotational engagement of the adjustment plate.

Referring to FIG. 11, the handle 210 includes a shaft 230 with a slot 232 in the end thereof. With the handle 210 in the closed position, the slot 232 is aligned with an alignment plate 234 attached to the rear of the adjustment plate 182. The adjustment plate 182 may be rotated to properly align the wafer thereon, with the alignment plate 234 traveling within the slot 232. To uplock the handle 210 the adjustment plate 182 is realigned to "zero" thus permitting rotational movement of the handle 210, while simultaneously preventing rotational movement (substantially all) of the adjustment plate 182. It is to be understood that any suitable lock out mechanism may likewise be used.

Figure 12:
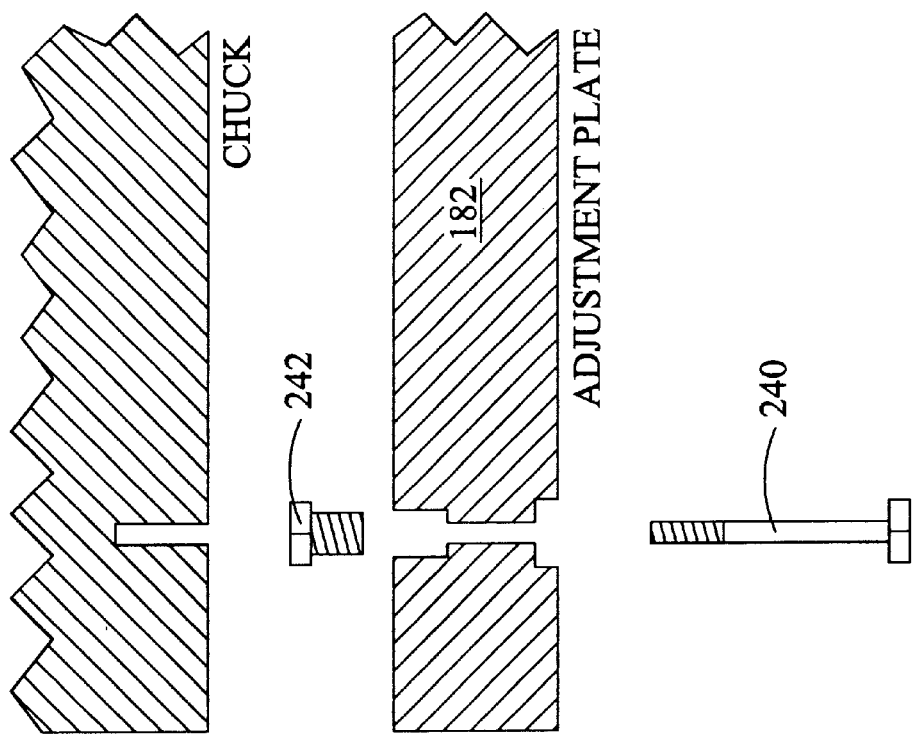
FIG. 12 illustrates traditional adjustment of the orientation of the chuck.

When one or more chuck assembly elements are supported by the adjustment plate 182, the upper surface of the chuck assembly should have a suitable orientation with respect to the probes, such as co-planar. Referring to FIG. 12, to adjust the orientation of the chuck assembly, the positional stage 184 is extended to provide convenient access to loosen threaded screws 240. The threaded screws 240 interconnect the chuck to the adjustment plate 182. Next an adjusting screw 242, such as a jack screw, is rotated to adjust the spacing between the adjustment plate and the chuck. Then the threaded screw 240 is tightened to rigidly secure the adjustment plate to the chuck. The positional stage is then slid back into the probe station and locked in place. At this point the actual orientation of the upper surface of the chuck assembly may be determined. Normally, the positional stage is adjusted several times to achieve accurate orientation. Unfortunately, this trial and error process of extending the positioning stage from the probe station, adjusting the orientation of the upper surface of the chuck assembly by adjusting one or more adjusting screws 242, and repositioning the positioning stage in the probe station, may take considerable time.

Figure 13:
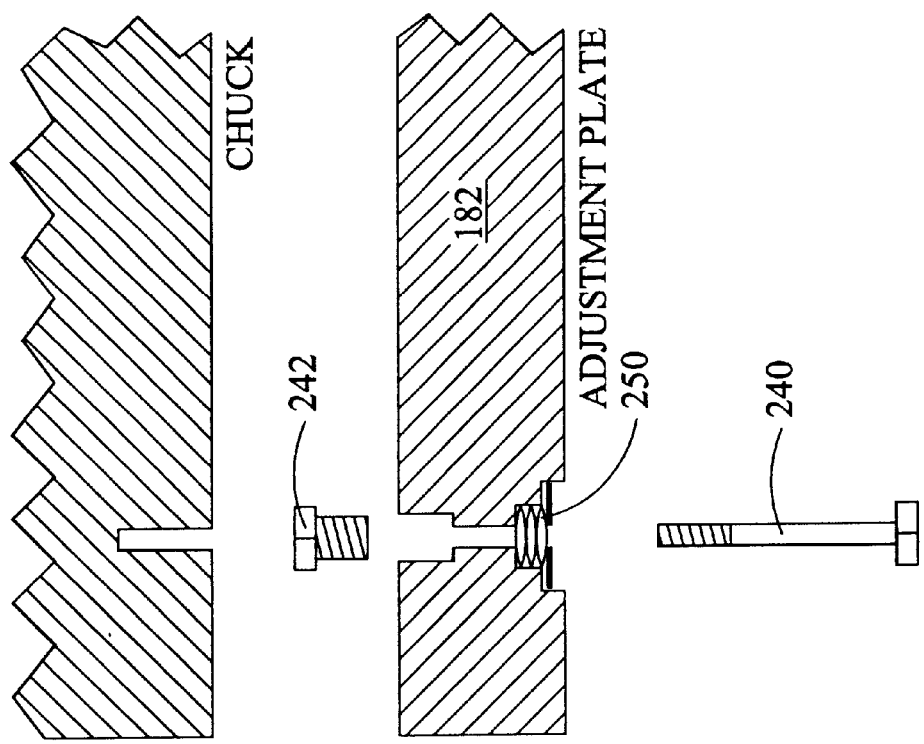
FIG. 13 illustrates a modified adjustment of the orientation of the chuck.

After consideration of this prolonged process of adjusting the orientation of the upper surface of the probe assembly, the present inventors came to the realization that loosening the threaded screw 240 relaxes the chuck from the adjustment plate 182. The amount of relaxation is hard to determine because the weight of the chuck assembly would make it appear that the chuck, jack screw, and adjustment plate are held together. Also, by adjusting the jack screw 242 and measuring the resulting movement of the chuck assembly provides an inaccurate result. In order to reduce the relaxation of the chuck and the adjustment plate, the present inventors determined that the threaded screw 240 should be tensioned so that the chuck does not significantly relax with respect to the adjustment plate. Referring to FIG. 13, one technique to tension the threaded screw is to provide a set of springs 250 under the head of the screw to provide an outwardly pressing force thereon when the threaded screw 240 is loosened. In this manner the relaxation between the chuck and the adjustment plate is reduced, resulting in a more accurate estimate of the adjustment of the orientation of the upper chuck assembly element. This reduces the frustration experienced by the operator of the probe station in properly orientating the chuck assembly. In addition, by loosening the threaded screws slightly, the chuck assembly may be more easily oriented by adjusting the jack screws while the probe station is in its locked position within the probe station. Thereafter, the positioning stage is extended and the threaded screws are tightened. It is to be understood that any structure may likewise be used to provide tension between the chuck assembly element and the adjustment plate while allowing adjustment of the spacing between the adjustment plate and the chuck assembly element, or otherwise adjusting the orientation of the chuck.

Normally it is important during testing to isolate the probe station from the earth and other nearby devices that may impose vibrations or other movement to the probe station, and hence the device under test. With proper isolation, the probe station may provide more accurate measurements. Typically the probe station is placed on a flat table having a surface somewhat larger than the probe station itself to provide a stable surface and reduce the likelihood of inadvertently sliding the probe station off the table. The table includes isolation, such as pneumatic cylinders, between the floor and the table surface. Also, it is difficult to lift the probe station onto the table in a controlled manner that does not damage the table and/or probe station. Further, the probe station is prone to being damaged by being bumped.

Figure 14:
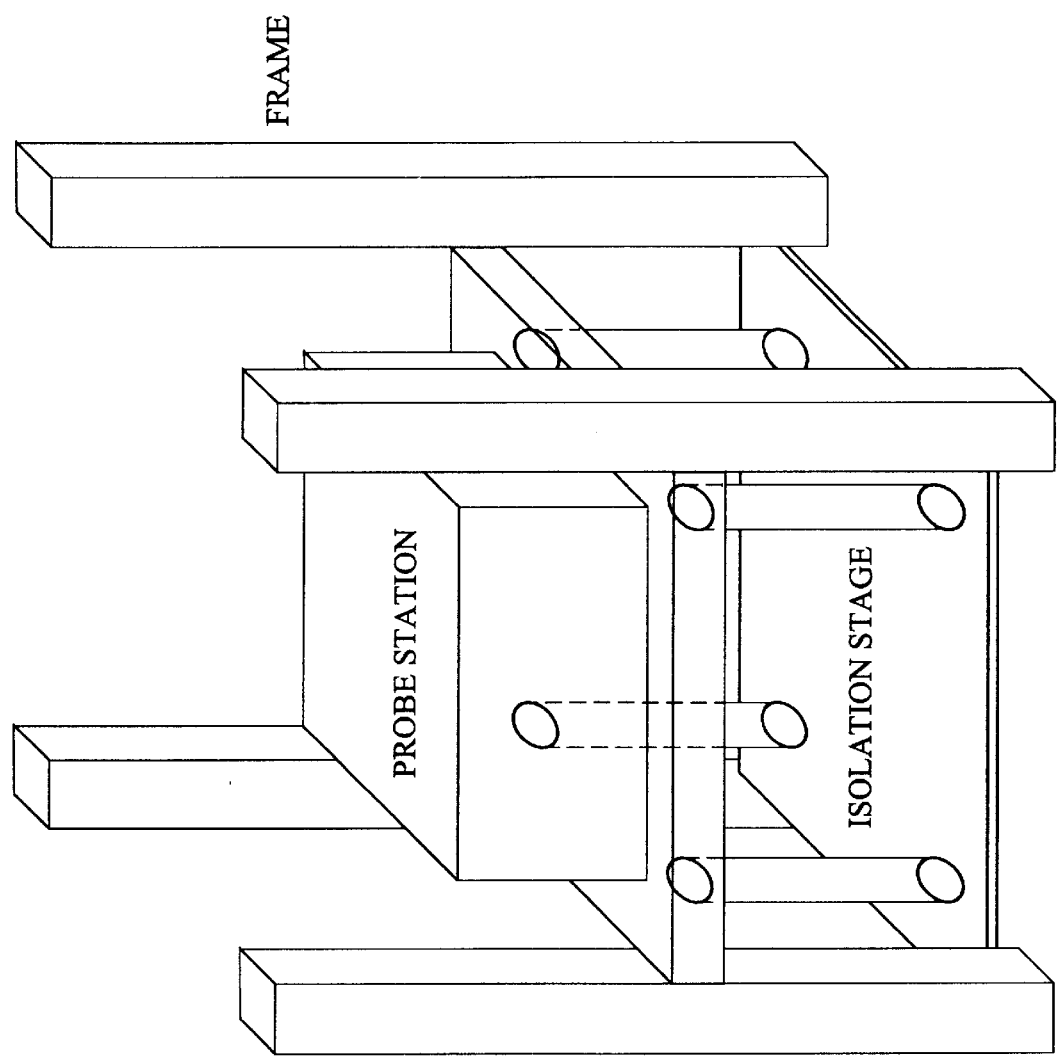
FIG. 14 illustrates a probe station supported by an isolation stage, both of which are surrounded by a frame.

To overcome the aforementioned limitations regarding the size of the probe station, the present inventors came to the realization that an integrated isolation stage, probe station, and frame provides the desired benefits, as illustrated in FIG. 14. The integrated isolation stage and probe station eliminates the likelihood of the probe station falling off the isolation stage. The top of the isolation stage may likewise form the base for the probe station, which reduces the overall height of the probe station, while simultaneously providing a stable support for the probe station. To protect against inadvertently damaging the probe station a frame at least partially surrounds the isolation stage and the probe station.

Figure 15:
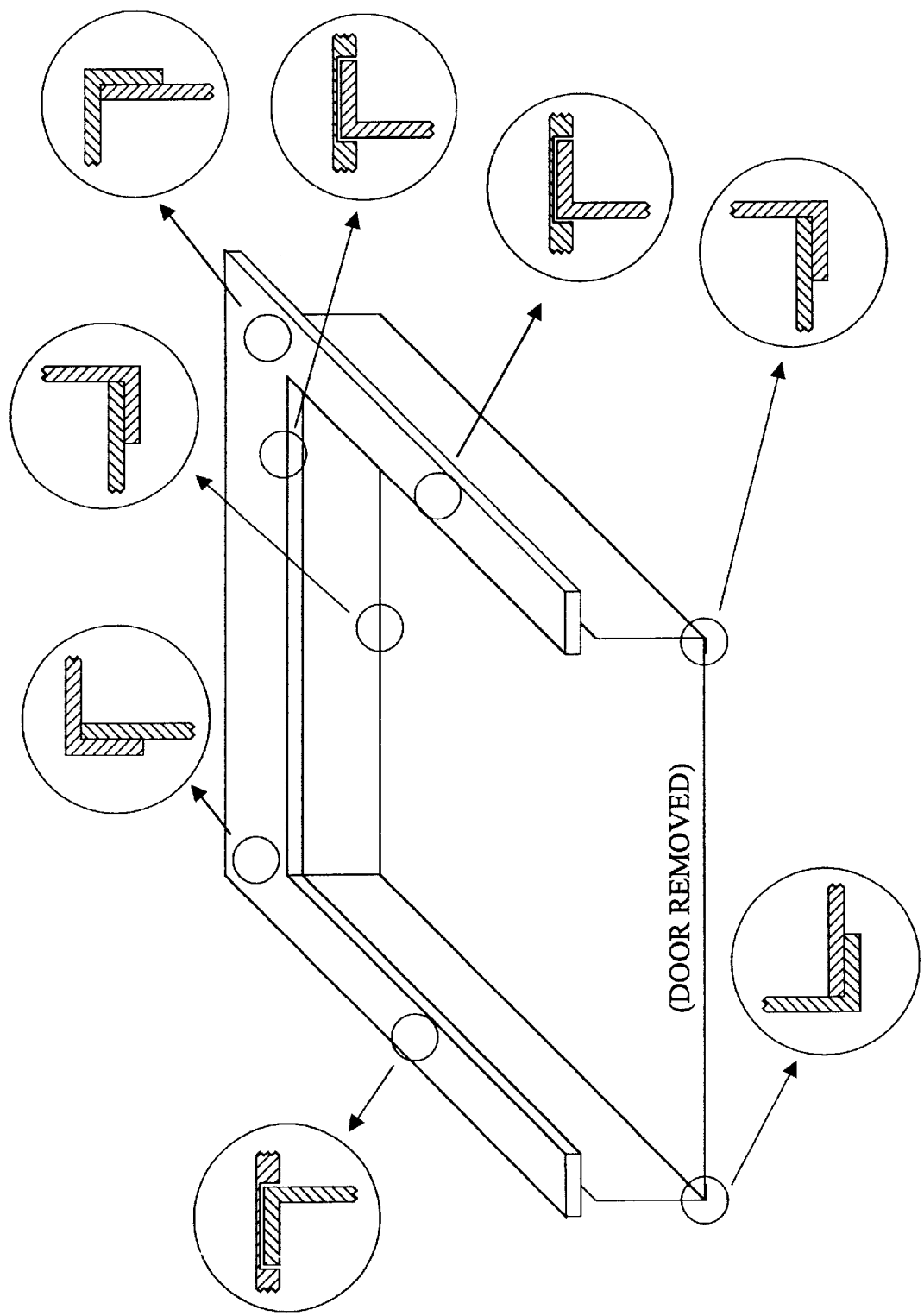
FIG. 15 illustrates the engagement of the sides of the environmental control enclosure.
Figure 16:
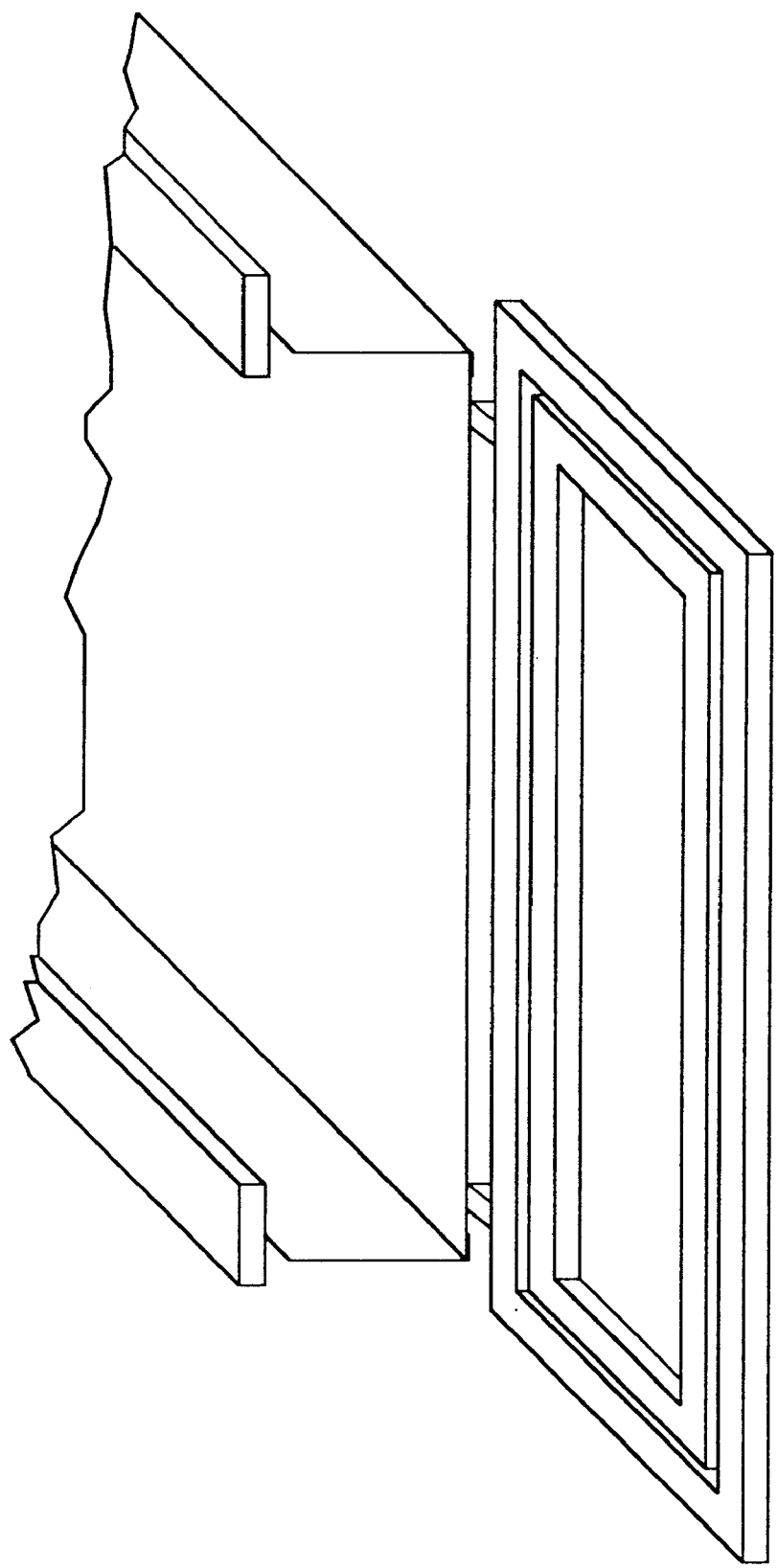
FIG. 16 illustrates the engagement of a door to the environmental control enclosure.

Even with extensive shielding and guarding existing environmental enclosures still seem to be inherently prone to low levels of noise. After consideration of the potential sources of noise, the present inventors determined that the construction of the environmental control enclosure itself permits small leakage currents to exist. Existing environmental control enclosures include one plate screwed or otherwise attached to an adjoining plate. In this manner, there exists a straight line path from the interior of the environmental control enclosure to outside of the environmental control enclosure. These joints are also prone to misalignment and small gaps there between. The gaps, or otherwise straight paths, provide a convenient path for leakage currents. Referring to FIGS. 15 and 16, to overcome the limitation of this source of leakage currents the present inventors redesigned the environmental control enclosure to include all (or substantial portion) joints having an overlapping characteristic. In this manner, the number of joints that include a straight path from the interior to the exterior of the environmental control enclosure is substantially reduced, or otherwise eliminated.

What is claimed is:

1. A chuck assembly including a rotational member and an auxiliary chuck comprising:
   (a) said rotational member defining an upper surface suitable for supporting a chuck thereon wherein said rotational member is rotatable with respect to said chuck assembly; and
   (b) said auxiliary chuck being free from rotating with respect to said chuck assembly, said auxiliary chuck having an upper surface thereon having an elevation that is above said upper surface of said rotational member.

2. The chuck assembly of claim 1 wherein said rotational member has a planar upper surface.

3. The chuck assembly of claim 2 wherein said chuck assembly has a planar upper surface.

4. The chuck assembly of claim 3 wherein said rotational member planar upper surface and said chuck assembly planar upper surface are substantially coplanar.

5. The chuck assembly of claim 2 wherein said auxiliary chuck supports said test substrate at a location above said rotational member.

6. The chuck assembly of claim 1 wherein chuck assembly includes a movement assembly for moving said rotational member in a lateral direction.

7. The chuck assembly of claim 6 wherein said auxiliary chuck moves together with said rotational member in a lateral direction.

8. The chuck assembly of claim 1 wherein said auxiliary chuck is suitable to support at least one test substrate thereon.

9. A chuck assembly including a rotational member and a movement member comprising:
   (a) said rotational member suitable for supporting a chuck thereon wherein said rotational member is rotatable with respect to said chuck assembly;
   (b) said movement member mechanically interconnected with said rotational member so as to selectively rotate said rotational member; and
   (c) said rotational member being substantially free from exerting a downwardly directed force on said movement member while said movement member rotates said rotational member.

10. The chuck assembly of claim 9 wherein rotational member includes a tab, said movement member includes a slot that engages said tab.

11. The chuck assembly of claim 10 wherein rotational movement of said slot causes rotational movement of said rotational member.

12. The chuck assembly of claim 9 wherein said rotational member is supported by a positioning stage.

13. The chuck assembly of claim 12 wherein said positioning stage includes a pair of spaced apart linear bearings.

14. The chuck assembly of claim 13 wherein said positioning stage is the primarily support for said rotational member.

15. The chuck assembly of claim 9 wherein a substantially constant vertical spacing is maintained between said movement member and said rotational member while said rotational member is being rotated.

16. The chuck assembly of claim 15 wherein said chuck assembly provides z-axis movement of said rotational member while maintaining said substantially constant vertical spacing.

17. A chuck assembly including a rotational member and a base assembly comprising:
   (a) said rotational member suitable for supporting a chuck thereon wherein said rotational member is rotatable with respect to said chuck assembly; and
   (b) said rotational member laterally movable with respect to said base assembly when said rotational member is in at least one predefined rotational orientation and said rotational member free from being laterally movable with respect to said base assembly when said rotational member is not in said at least one predefined rotational orientation.

18. The chuck assembly of claim 17 wherein said predefined rotational orientation is zero degrees.

19. The chuck assembly of claim 17 wherein said predefined rotational orientation is a predefined range of values.

20. The chuck assembly of claim 17 wherein said rotational member is maintained free from substantially all rotational movement while said rotational member is in an extended position with respect to said base.

21. A chuck assembly including a rotational member comprising:
   (a) said rotational member supporting a chuck thereon; and
   (b) a plurality of adjustment members suitable to adjust the horizontal orientation of said chuck with respect to said rotational member while maintaining said rotational member and said chuck in a tensioned state while adjusting said orientation.

22. The chuck assembly of claim 21 wherein said tensioned state is provided by said adjustment members maintaining the spacing between said rotational member and said chuck.

23. The chuck assembly of claim 22 wherein said adjustment members are threaded screws.

* * * * *

UNITED STATES PATENT AND TRADEMARK OFFICE
CERTIFICATE OF CORRECTION

PATENT NO. : 6,914,423 B2
DATED : July 5, 2005
INVENTOR(S) : Nordgren et al.

It is certified that error appears in the above-identified patent and that said Letters Patent is hereby corrected as shown below:

Column 8,
Line 38, change "To uplock the handle" to -- To unlock the handle --.

Signed and Sealed this

Tenth Day of January, 2006

JON W. DUDAS
*Director of the United States Patent and Trademark Office*